United States Patent [19]

Rovell

[11] 4,247,791
[45] Jan. 27, 1981

[54] CMOS MEMORY SENSE AMPLIFIER

[75] Inventor: Alexander Rovell, Yorba Linda, Calif.

[73] Assignee: Rockwell International Corporation, El Segundo, Calif.

[21] Appl. No.: 892,817

[22] Filed: Apr. 3, 1978

[51] Int. Cl.³ .......................... H03K 5/24; G11C 7/00
[52] U.S. Cl. .......................... 307/355; 307/DIG. 3; 365/190; 365/205
[58] Field of Search ............... 307/238, 279, 355, 356, 307/358, 362, DIG. 1, DIG. 3; 365/205, 207, 208, 190, 191

[56] References Cited

U.S. PATENT DOCUMENTS

| 3,891,977 | 6/1975 | Amelio et al. | 307/DIG. 3 X |
| 4,004,158 | 1/1977 | Morgan | 307/362 |
| 4,024,512 | 5/1977 | Amelio et al. | 307/DIG. 3 X |
| 4,031,522 | 6/1977 | Reed et al. | 307/DIG. 3 X |
| 4,045,686 | 8/1977 | Masuda | 307/279 X |
| 4,087,704 | 5/1978 | Mehta et al. | 307/DIG. 3 X |
| 4,122,549 | 10/1978 | Kinoshita | 307/DIG. 3 X |
| 4,123,799 | 10/1978 | Peterson | 307/DIG. 3 X |
| 4,124,808 | 11/1978 | Shieu et al. | 307/DIG. 3 X |
| 4,130,897 | 12/1978 | Horne et al. | 307/DIG. 3 X |
| 4,136,292 | 1/1979 | Suzuki et al. | 307/DIG. 3 X |

OTHER PUBLICATIONS

Lohman, "Applications of MOSFET's in Microelectronics", *SCP and Solid-State Technology* (Pub.), pp. 23-29, 3/1966.
Lee et al., "Cross-Coupled True and Complement Powering Circuit", *IBM Tech. Discl. Bull.*, vol. 16, No. 3, pp. 992-993, 8/1973.

*Primary Examiner*—Stanley D. Miller, Jr.
*Attorney, Agent, or Firm*—H. Fredrick Hamann; Morland C. Fischer; Wilfred G. Caldwell

[57] ABSTRACT

A complementary metal oxide semiconductor (CMOS) field effect transistor (FET) memory sense amplifier to detect a relatively small differential voltage that is superimposed on a relatively large common mode precharge signal. The sense amplifier is implemented so as to provide latched output signals after a short time delay and in response to sensed input signals that are supplied via a pair of data bus lines.

5 Claims, 2 Drawing Figures

CMOS MEMORY SENSE AMPLIFIER

The invention herein described was made in the course of or under a contract or subcontract with the U.S. Air Force.

BACKGROUND OF THE INVENTION

1. Field of the Invention

This invention relates to a radiation hardened, CMOS memory sense amplifier that is sensitive to relatively small differential voltage signals supplied thereto from a selected memory cell via a pair of data bus lines.

2. Statement of the Prior Art

As is known to those skilled in the art, many sense amplifiers are available to detect output signals derived from an array of semiconductor memory cells. However, these prior art memory sense amplifiers are typically characterized by relatively low input impedance. As a result, the loading effects of the prior art sense amplifiers may cause the undesirable destruction or alteration of data that is stored in a selected memory cell when that memory cell is read or sensed. Otherwise, a time consuming refresh cycle is required to re-establish the contents of the selected memory cell after the read operation is completed. Moreover, low input impedance renders the prior art sense amplifiers undesirably susceptible to internal disturbances that may be caused as the result of a nuclear radiation event.

Examples of prior art sense amplifiers that include some of the shortcomings described by the foregoing paragraph are found in the following U.S. patents:

U.S. Pat No. 3,959,781 May 25, 1976
U.S. Pat. No. 3,978,459 Aug. 31, 1976
U.S. Pat. No. 4,010,453 Mar. 1, 1977
U.S. Pat. No. 4,028,557 June 7, 1977
U.S. Pat. No. 4,031,415 June 21, 1977

SUMMARY OF THE INVENTION

Briefly, and in general terms, a CMOSFET memory sense amplifier is disclosed that is sensitive to relatively small differential voltage input signals supplied by a pair of data bus lines. The sense amplifier is comprised of a data latch and a pair of inverters, each inverter respectively connected between an output terminal of the data latch and an output terminal of the sense amplifier. The operation of the sense amplifier is controlled by recurring strobe signals. Each one of the pair of data bus input lines is respectively connected between an array of memory cells and the gate electrode of a field effect transistor that forms the data latch. Therefore, the present sense amplifier is characterized by a high input impedance. Moreover, the present sense amplifier is adapted to drive a non-symmetrical (capacitive) load from the output terminals thereof.

In operation, the sense amplifier is initially rendered in a quiescent mode, prior to the sense operation, during which time the pair of data bus lines are precharged to a common mode voltage level. In a subsequent time interval, the sense amplifier is rendered in an active mode by means of the strobe signals, during which time the contents of a selected memory cell are sensed via the pair of data bus lines. The sensed memory cell information is stored at the output terminals of the data latch, whereby the logical state of the sense amplifier is preserved during the following quiescent time interval when the input memory cell information signals are terminated and the data bus lines are again precharged to the common mode voltage level.

DESCRIPTION OF THE PREFERRED EMBODIMENT

Figure 1:
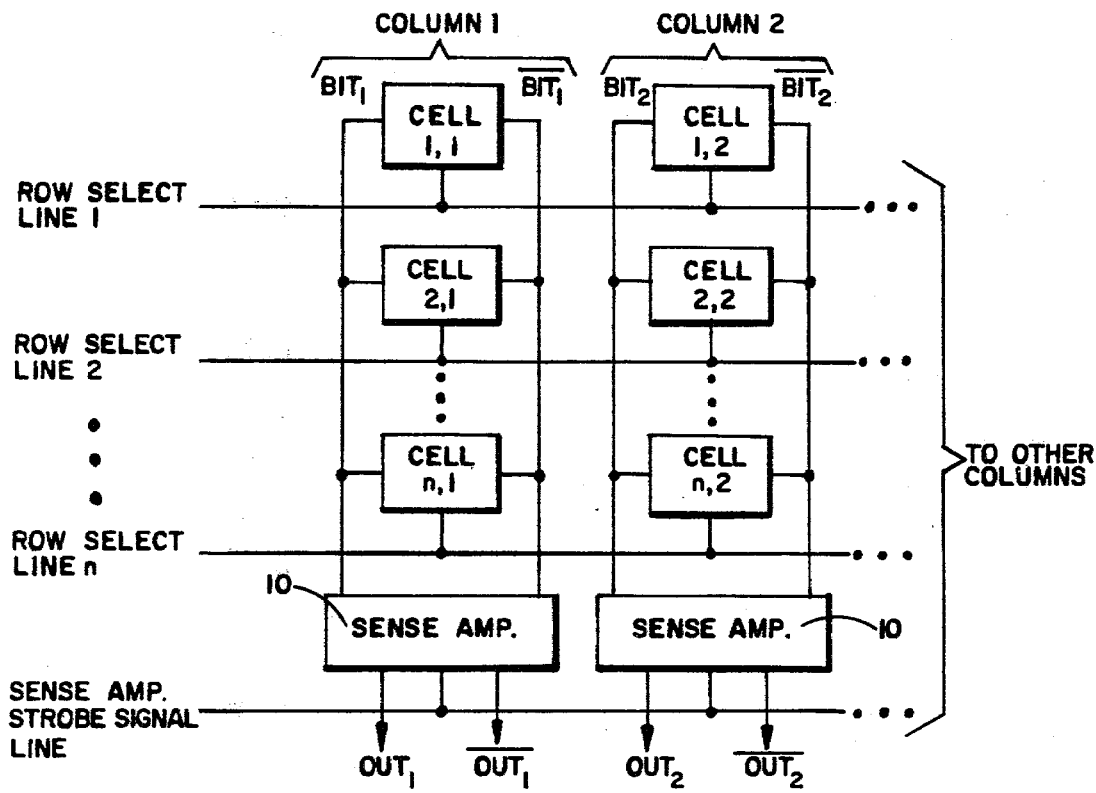
FIG. 1 is a block diagram representative of a typical interconnection of an array of conventional semiconductor memory cells with a plurality of the sense amplifiers of the present invention.

FIG. 1 shows a typical interconnection of an array of conventional semiconductor memory cells with a plurality of identical sense amplifiers 10, which sense amplifiers 10 form the present invention. Inasmuch as the interconnection of the memory cell array with the sense amplifiers 10 is well known, only a brief description thereof is presented herein. The output terminals of each of a column of the memory cells are connected to a respective pair of BIT and $\overline{BIT}$ data bus lines. Each pair of BIT and $\overline{BIT}$ data bus lines is connected to input terminals of a respective sense amplifier 10 so as to provide differential signals thereto that are indicative of the logical state of a selected memory cell from each column of memory cells. Each memory cell from a row of the memory cells is connected to a respective row select line. A row select line applies an enabling signal to selectively energize a particular memory cell for the purpose of reading or writing logical information via the corresponding pair of data bus lines. A suitable source of strobe input signals is connected, via a common strobe signal line, to each of the sense amplifiers 10 to, thereby, sychronously control the operation thereof.

Figure 2:
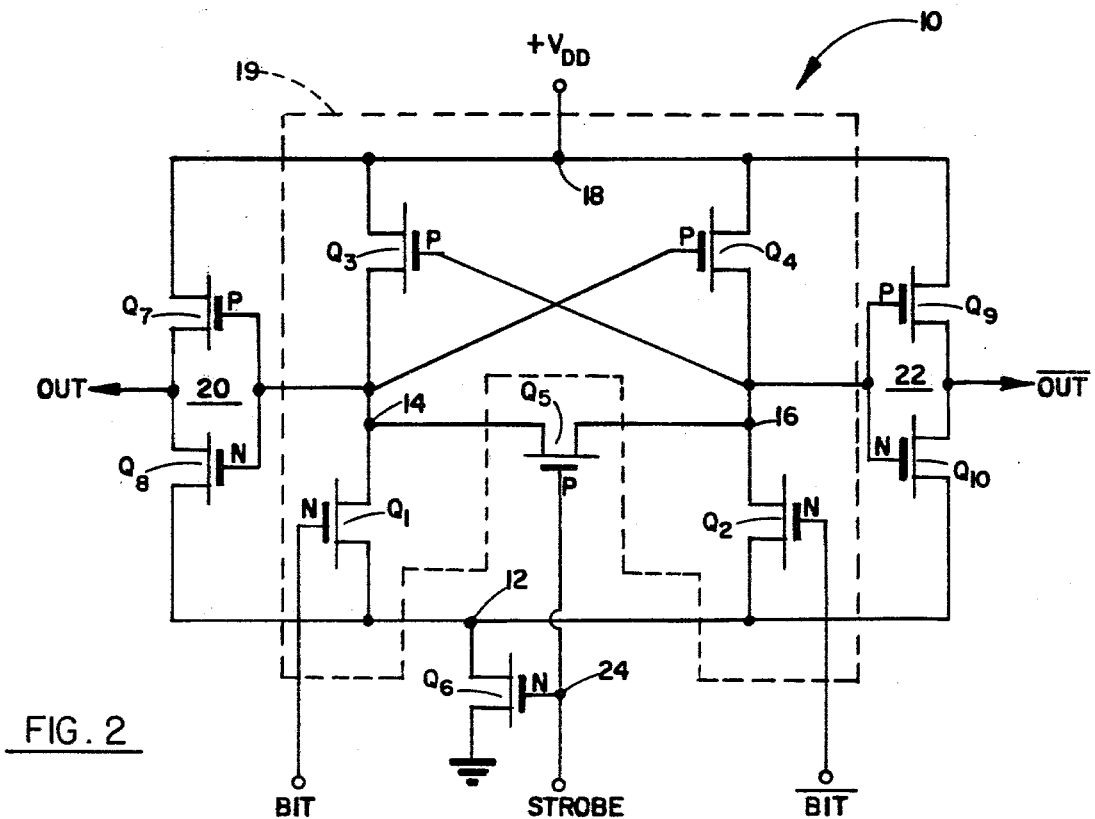
FIG. 2 is a schematic circuit to show a preferred implementation of the CMOS sense amplifier which forms the present invention.

In accordance with the instant invention and referring to FIG. 2 of the drawings, a preferred CMOS sense amplifier configuration is illustrated. The sense amplifier 10 includes first and second n-channel field effect transistors (FETs) $Q_1$ and $Q_2$. FET $Q_1$ is connected between an electrical junction 12 and an electrical junction 14. FET $Q_2$ is connected between the electrical junction 12 and an electrical junction 16. A first BIT data bus line is connected to an input terminal of the sense amplifier 10 at the gate electrode of the n-channel FET $Q_1$. The opposite state $\overline{BIT}$ data bus line is connected to another input terminal of the sense amplifier 10 at the gate electrode of the n-channel FET $Q_2$. By virtue of the connections of the BIT and $\overline{BIT}$ data bus lines to the gate electrodes of FETs $Q_1$ and $Q_2$, respectively, the loading of the data bus lines is, thereby, reduced to the input capacitances of FETs $Q_1$ and $Q_2$. As a result of these input connections, and unlike the prior art sense amplifiers, a high input impedance is achieved. Therefore, the load presented to a pair of data bus lines by the sense amplifier 10 is minimized, so as to prevent destruction of data that is stored in a selected memory cell and to reduce the deterioration of the information signals that are detected by the sense amplifier during a sense operation.

A first p-channel FET $Q_3$ is connected between the electrical junction 14 and an electrical junction 18. A second p-channel FET $Q_4$ is connected between the electrical junctions 16 and 18. The electrical junction 18 is connected to a source of relatively positive supply voltage, designated $V_{DD}$, which is typically +11 volts d.c. FETs $Q_3$ and $Q_4$ are cross-connected relative to one another. That is, the gate electrode of FET $Q_3$ is connected to one conduction path electrode of FET $Q_4$ at the electrical junction 16. The gate electrode of FET $Q_4$ is connected to one conduction path electrode of FET $Q_3$ at the electrical junction 14. The respective conduction paths of FETs $Q_1$ and $Q_3$ and FETs $Q_2$ and $Q_4$ are connected in electrical series between the electrical junctions 12 and 18. Therefore, the interconnection of FETs $Q_1$–$Q_4$ forms a data latch 19 which, as will be explained in greater detail hereinafter, maintains its logical state subsequent to the termination of the sense amplifier input signals that are supplied via the BIT and $\overline{BIT}$ data bus lines.

The output terminals (i.e. electrical junctions 14 and 16) of the data latch 19 are respectively connected to a pair of inverters 20 and 22. Inverter 20 is comprised of a p-channel FET $Q_7$ and an n-channel FET $Q_8$. The conduction paths of FETs $Q_7$ and $Q_8$ are connected together in electrical series between the electrical junctions 12 and 18. The gate electrodes of FETs $Q_7$ and $Q_8$ are connected together at the data latch output terminal 14. A first output terminal, designated OUT, of the sense amplifier 10 is connected at a convenient point between the series connected conduction paths of FETs $Q_7$ and $Q_8$. Inverter 22 is comprised of a p-channel FET $Q_9$ and an n-channel FET $Q_{10}$. The conduction paths of FETs $Q_9$ and $Q_{10}$ are connected together in electrical series between the electrical junctions 12 and 18. The gate electrodes of FETs $Q_9$ and $Q_{10}$ are connected together at the data latch output terminal 16. A second output terminal, designated $\overline{OUT}$, of the sense amplifier 10 is connected at a convenient point between the series connected conduction paths of FETs $Q_9$ and $Q_{10}$. Inverters 20 and 22 buffer the data latch and provide the required output to drive a load (not shown). By way of example, the inverters 20 and 22 are adapted to drive a relatively large, non-symmetrical load capacitance.

Two additional FETs $Q_5$ and $Q_6$ are employed to either selectively enable or disable the sense amplifier 10 in response to an external strobe signal. A p-channel FET $Q_5$ is connected between the data latch output terminals, which comprise the electrical junctions 14 and 16. An n-channel FET $Q_6$ is connected between the electrical junction 12 and a source of relatively negative supply voltage, such as ground. The gate electrodes of FETs $Q_5$ and $Q_6$ are connected together at an electrical junction 24 to receive a supply of strobe signals. The strobe signals control the conductivity of FETs $Q_5$ and $Q_6$ and, as will also be explained in greater detail hereinafter, synchronously control the operation of the sense amplifier 10. Moreover, FETs $Q_5$ and $Q_6$ act to bias the data latch to a quiescent state in preparation for an information sensing operation.

In a preferred embodiment of the invention, the channel lengths of FETs $Q_1$–$Q_{10}$ are approximately identical. However, FET $Q_6$ (which provides the ground return for the sense amplifier 10) is selected with a substantially larger channel width than those of FETs $Q_7$ and $Q_9$. Moreover, the channel widths of FETs $Q_7$ and $Q_9$ are larger than those of FETs $Q_3$, $Q_4$, $Q_5$, $Q_8$ and $Q_{10}$. What is more, the channel widths of FETs $Q_3$, $Q_4$, $Q_5$, $Q_8$ and $Q_{10}$ are larger than those of the data latch FETs $Q_1$ and $Q_2$. By way of example, the channel widths of FET $Q_6$ is approximately five times larger than those of FETs $Q_1$ and $Q_2$ and two and one half times larger than those of FETs $Q_3$, $Q_4$, $Q_5$, $Q_8$ and $Q_{10}$. The channel widths of FETs $Q_7$ and $Q_9$ are approximately three times larger than those of FETs $Q_1$ and $Q_2$.

Figure 3:
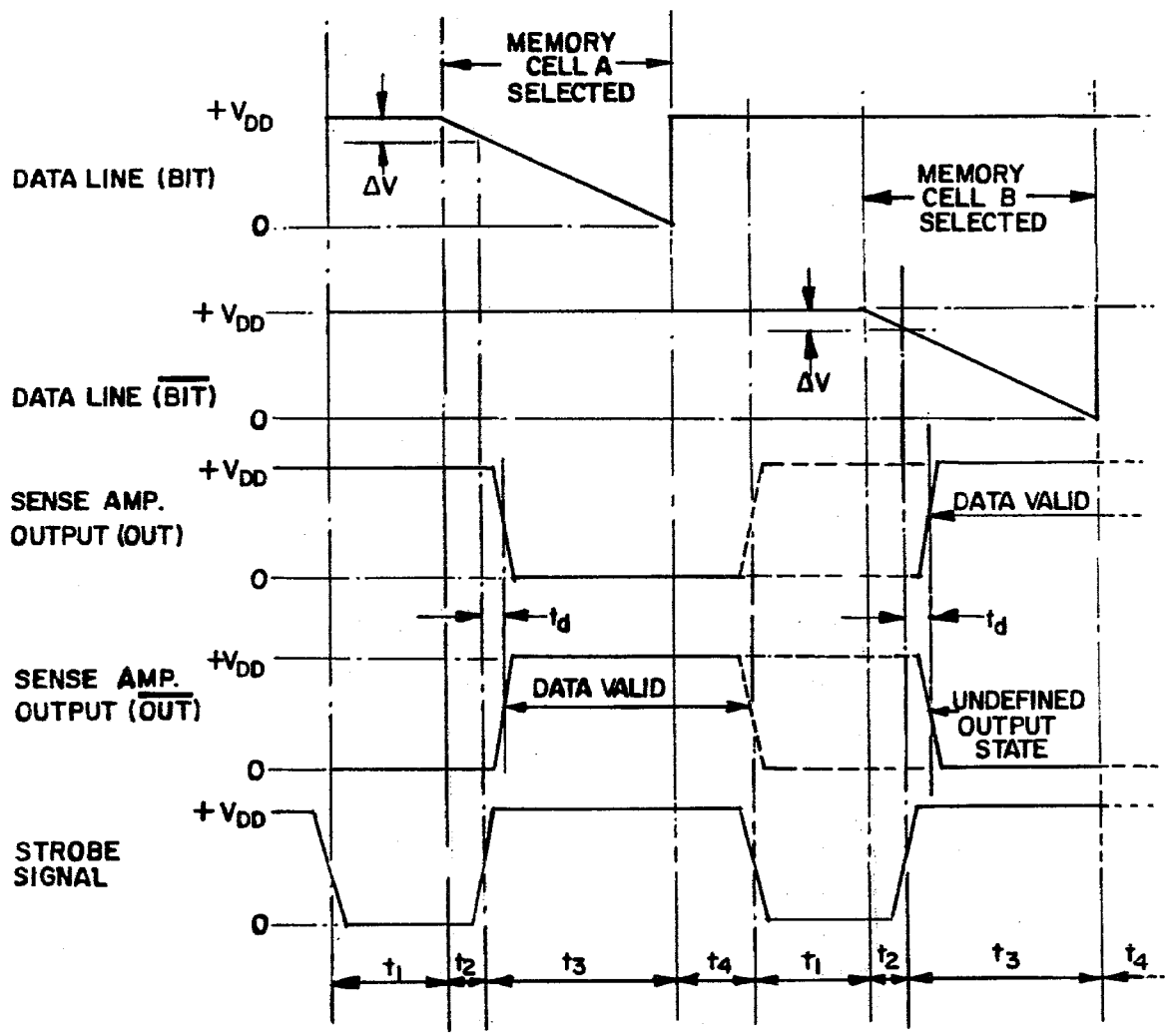
FIG. 3 shows the sequence of the signal waveforms occurring during a sense cycle and appearing on a pair of the data bus lines and at the output terminals of the presently disclosed sense amplifier.

A typical sequence of the signal wave forms appearing on a pair of BIT and $\overline{BIT}$ data bus lines and at the output terminals OUT and $\overline{OUT}$ during a sense cycle of the presently disclosed sense amplifier 10 of FIG. 2 is illustrated in FIG. 3. The operation of the sense amplifier 10 is disclosed while referring concurrently to FIGS. 2 and 3 of the drawings. During a first interval of time, designated $t_1$, that occurs prior to the sensing of an information signal from a selected memory cell, each one of the BIT and $\overline{BIT}$ data bus lines is precharged to a relatively positive common mode voltage level, such as $V_{DD}$. During the $t_1$ precharge time interval, the strobe signal that is applied to the sense amplifier and to the respective gate electrodes of FETs $Q_5$ and $Q_6$ at the electrical junction 24 has a relatively low (e.g. ground) signal level. Hence, FET $Q_6$ is rendered non-conductive which, thereby, separates the sense amplifier 10 from the relatively negative source of supply potential (i.e. ground) and, accordingly, disables the sense amplifier. As a result, the sense amplifier 10 operates in a quiescent state. The output terminals (i.e. electrical junctions 14 and 16) of the sense amplifier data latch 19 receive voltages equivalent to $+V_{DD}-V_{TP}$, where $V_{TP}$ represents the threshold voltage drop of a corresponding p-channel FET $Q_3$ or $Q_4$. During the $t_1$ time interval, p-channel FET $Q_5$ is rendered conductive, inasmuch as sufficient threshold voltage is applied to the gate-to-source junction thereof. Thus, the electrical junctions 14 and 16 are connected together via the conduction path of FET $Q_5$ so that the voltage applied to each of the electrical junctions 14 and 16 is identical. The voltage that is applied to the output terminals 14 and 16 of the data latch 19 is approximately one-half the relatively positive source voltage $V_{DD}$. Therefore, each of the FETs $Q_7$–$Q_{10}$, which forms the inverters 20 and 22, would be undesirably biased in the Class A region if the inverters 20 and 22 were otherwise referenced to ground via the conduction path of FET $Q_6$. However, inasmuch as FET $Q_6$ is rendered non-conductive, the ground return of inverters 20 and 22 is removed. Therefore, relatively high bias currents, that could be undesirably conducted through each of the inverter FETs $Q_7$–$Q_{10}$, are avoided.

The sensing operation begins during an interval of time designated $t_2$, when the common mode voltage $V_{DD}$ of one of the BIT or $\overline{BIT}$ data bus lines is discharged towards ground. A particular memory cell (e.g., that designated cell A in FIG. 3) is accessed by means of a row select line (as disclosed when referring to FIG. 1). Output information signals that are stored in the selected memory cell typically appear on the BIT and $\overline{BIT}$ data bus lines after a relatively long response time, due to the capacitance presented by the data bus lines. In order to minimize the data access time during the sense interval of time, $t_2$, it is, therefore, desirable for the sense amplifier 10 to be responsive to a relatively small voltage differential occurring between the data bus lines.

By the end of the $t_2$ time interval, one of the data bus lines (e.g. the BIT data line) is discharged by a voltage $\Delta V$. Moreover, the strobe signal that is applied to the gate electrodes of FETs $Q_5$ and $Q_6$ at the electrical junction 24 switches from ground to a relatively high signal level (e.g. $V_{DD}$). FET $Q_6$ is, thereby, rendered conductive, and a relatively negative supply voltage (i.e. ground) is applied via the conduction path thereof to each of the FETs $Q_1$–$Q_4$ which form the data latch 19 and to the FETs $Q_7$–$Q_{10}$ which form inverters 20 and 22. The sense amplifier 10 is, thereby, rendered in an active state. Also, by the end of the $t_2$ time interval, FET $Q_5$ is rendered non-conductive, inasmuch as insufficient threshold voltage is applied to the gate-to-source junction thereof, and electrical junctions 14 and 16 may, thereby, assume different voltage levels. Therefore, the n-channel FETs $Q_1$ and $Q_2$ present a load impedance to the p-channel FETs $Q_3$ and $Q_4$. The actual load impedance is dependent upon the voltage level of the memory cell information signals that are applied to the input terminals of the sense amplifier 10 via the pair of BIT and $\overline{BIT}$ data bus lines. By way of example, if the information voltage level on the BIT data bus line discharges from $V_{DD}$ towards ground by a voltage $\Delta V$, FET $Q_2$ provides a lower impedance at the end of the $t_2$ time interval than that provided by FET $Q_1$. Hence, electrical junction 16 charges to a lower voltage than that of electrical junction 14. The resulting differential voltage that occurs between the output terminals (i.e. electrical junctions 14 and 16) of the data latch 19 is regenerative due to the previously disclosed cross-coupled interconnection of FETs $Q_3$ and $Q_4$. The regenerative nature of the differential voltage that is applied to the electrical junctions 14 and 16 ultimately causes electrical junction 16 to fully discharge to a relatively negative voltage level (approximately ground) and electrical junction 14 to fully charge to a relatively positive voltage level (approximately $V_{DD}$) to thereby cause the sense amplifier data latch 19 to latch.

The aforementioned regenerative action of the differential voltage at the data latch output terminals 14 and 16 minimizes the response time, $t_d$, of the sense amplifier 10 at the beginning of the next interval of time, designated $t_3$. During the balance of the $t_3$ time interval, wherein the strobe signal continues to have a relatively high signal level, the sense amplifier 10 stores information signals at the output terminals 14 and 16 of the data latch 19 in response to input signals supplied by the BIT and $\overline{BIT}$ data bus lines. Once the sense amplifier 10 assumes a given output state (i.e. after completion of the response time $t_d$), the sense amplifier maintains its output state for the remainder of the $t_3$ time interval. At the beginning of the following interval of time, designated $t_4$, during which time interval the strobe signal also maintains a high signal level, the input signals supplied to the sense amplifier via the BIT and $\overline{BIT}$ data bus lines are terminated, and the data bus lines are returned to the positive common mode precharge voltage level. Nevertheless, the output state of the sense amplifier 10 is preserved throughout the $t_4$ time interval after the termination of the sensed input signals.

During the successive $t_3$ and $t_4$ time intervals, inverters 20 and 22 sense the voltages at the output terminals 14 and 16, respectively, of the sense amplifier data latch 19. The inverters 20 and 22 provide sufficient gain to drive the output (capacitive) load from the sense amplifier output terminals OUT and $\overline{OUT}$. Since the inverter 20 has an identical implementation to that of the inverter 22, electrical junctions 14 and 16 are provided with equal load capacitance regardless of any eventual imbalance caused by nonsymmetrical output loading. The voltage signals at electrical junctions 14 and 16 are, therefore, unaffected by an unbalanced load during the critical time (at the end of $t_2$) when the strobe signal that is applied to the electrical junction 24 has a positive going transistion level. Hence, during the $t_3$ and $t_4$ time intervals, the data that is stored by the sense amplifier 10 is valid. That is, the information signals stored by the sense amplifier 10 are in a condition that is suitable for application of external utilization means (not shown) via the sense amplifier output terminals OUT and $\overline{OUT}$. Moreover, the $t_4$ time interval is utilized to prepare the memory cell array for the selection of the next memory cell (e.g., that designated cell B in FIG. 3) from the array thereof while the output data of the previously selected memory cell (cell A) continues to be held and sampled.

During the subsequent $t_1$ precharge time interval of the next sense cycle, the strobe signal is again terminated (i.e. assumes a relatively low signal level), and the sense amplifier output data is no longer valid. When the strobe signal returns to the relatively low signal level, the sense amplifier accordingly returns to its quiescent state. Moreover, as previously disclosed, FET $Q_6$ is rendered non-conductive to separate the sense amplifier 10 from the source of relatively negative supply voltage (ground). Hence, FET $Q_5$ is once again rendered conductive. The voltage differential that previously existed during the preceding sense cycle between electrical junctions 14 and 16 is, thereby, discharged via the conduction path of FET $Q_5$ in preparation for the next sense operation.

It will be apparent that while a preferred embodiment of the invention has been shown and described, various modifications and changes may be made without departing from the true spirit and scope of the invention. For example, each of the FETs $Q_1$–$Q_{10}$ which form the present sense amplifier 10 may be fabricated from a layer of silicon on a sapphire substrate. By virtue of the silicon on sapphire (SOS) fabrication techniques and the relatively high input impedance provided to the BIT and $\overline{BIT}$ data bus lines, the susceptibility of the memory cell array to internal disturbances of the instant sense amplifier 10 that may be caused by the undesirable effects of a nuclear radiation event is substantially reduced. Thus, the information signals that are stored in the memory cell array are protected from loss or alteration as a consequence of a nuclear radiation occurrence.

Having thus set forth a preferred embodiment of the instant invention, what is claimed is:

1. A sense amplifier connected to an array of memory cells by means of a pair of data bus lines so as to sense information signals contained in selected ones of the memory cells, said sense amplifier comprising:

first and second pairs of multi-terminal transistor devices having respective conduction paths and control electrodes, first transistor devices from each of said first and second pairs thereof connected in electrical series with one another between first and second electrical junctions, second transistor devices from each of said first and second pairs thereof connected in electrical series with one another between third and fourth electrical junctions, the control electrode of the first transistor device of said first pair thereof connected to a conduction path electrode of the second transistor device of said first pair thereof, and the control electrode of the second transistor device of said first pair thereof connected to a conduction path electrode of said first transistor device of said first pair thereof, each of the respective control electrodes of the transistor devices of said second pair thereof connected to a corresponding data bus line, whereby a relatively high input impedance is achieved for said sense amplifier, each of the multi-terminal transistor devices of the first pair thereof being a p-channel field effect transistor, each of the multi-terminal transistor devices of the second pair thereof being a n-channel field effect transistor, said first and third electrical junctions being common electrical junctions, said second and fourth electrical junctions being common electrical junctions, a source of recurring strobe input signals to control the conductivity of said sense amplifier, a first source of supply voltage, a first additional multi-terminal transistor device having a conduction path and a control electrode, the control electrode of said first additional transistor device connected to said source of strobe signals, and the conduction path of said first additional transistor device selectively connecting each of the second and fourth electrical junctions to said first source of supply voltage to thereby enable said sense amplifier, a second source of supply voltage wherein the first and third electrical junctions are connected to said second source of supply voltage, a second additional multi-terminal transistor device having a conduction path and a control electrode, the control electrode of said second additional transistor device connected to said source of strobe signals, and the conduction path of said second additional transistor device connected between the connection of the control electrode of the first transistor device of said first pair thereof to the conduction path electrode of the second transistor device of said first pair thereof and the connection of the control electrode of the second transistor device of said first pair thereof to the conduction path electrode of the first transistor device of said first pair thereof, said first and second additional multi-terminal transistor devices being field effect transistors having an opposite conductivity type relative to one another, the interconnection of said first and second pairs of multi-terminal transistor devices forms a data latch, the control electrodes of each of said second pair of transistor devices corresponding to data latch input terminals, the connection of the control electrode of the first transistor device of said first pair thereof to the conduction path electrode of the second transistor device of said first pair thereof and the connection of the control electrode of the second transistor device of said first pair thereof to the conduction path electrode of the first transistor device of said first pair thereof corresponding to data latch output terminals, first and second amplifier stages, each of said stages having input and output terminals, the data latch output terminals respectively connected to the input terminals of said first and second amplifier stages, each of said first and second amplifier stages being comprised of a pair of series connected field effect transistors having an opposite conductivity type relative to one another, and said data bus lines being precharged to reduce amplifier access time to data stored in said cells and to preserve said data in a radiation environment.

2. A sense amplifier to interface with an array of memory cells via a pair of data bus lines, said sense amplifier comprising:

a source of supply voltage, a data latch having first and second input and output terminals and comprising first, second, third and fourth transistor devices, each having a respective control electrode and a conduction path, said first and second transistor devices connected in electrical series with one another and said third and fourth transistor devices connected in electrical series with one another, the control electrodes of said second and fourth transistor devices corresponding to the first and second data latch input terminals to be respectively connected to the pair of data bus lines to provide a high sense amplifier input impedance, a fifth transistor device having a control electrode and a conduction path that is connected between the first data latch output terminal including an interconnection of the control electrode of said first transistor device with a conduction path electrode of said third transistor device, and the second data latch output terminal including an interconnection of the control electrode of said third transistor device with a conduction path electrode of said first transistor device, a sixth transistor device having a control electrode and a conduction path that is connected between said source of supply voltage and an electrical junction including conduction path electrodes of said second and fourth transistor devices, a source of supply of recurring strobe signals connected to the respective control electrodes of said fifth and sixth transistor devices, whereby said fifth transistor device is rendered conductive during a first strobe interval in order to equalize the signals applied to the data latch output terminals and to disable and sense amplifier, and said sixth transistor device is rendered conductive during a second strobe interval to enable said sense amplifier to read information from a selected one of the array of memory cells via said data bus lines and to store an indication of the information at the data latch output terminals, said data bus lines being precharged, and the channel widths of the first and third transistor devices being larger than the channel widths of said second and fourth transistor devices, whereby any data appearing at said output terminals will be preserved during precharging of said data bus lines.

3. The sense amplifier recited in claim 2, further including first and second amplifier stages, the first and second data latch output terminals respectively connected to input terminals of said first and second amplifier stages.

4. The sense amplifier recited in claim 2, wherein said first, third and fifth transistor devices are p-channel field effect transistors, and said second, fourth and sixth transistor devices are n-channel field effect transistors.

5. The sense amplifier recited in claim 4, wherein the channel width of the sixth field effect transistor is substantially larger than those of the first, second, third, fourth and fifth field effect transistors.

* * * * *